United States Patent [19]
Poluzzi et al.

[11] 4,037,830
[45] July 26, 1977

[54] WAFER HANDLER

[75] Inventors: Henry Benjamin Poluzzi, Poughkeepsie, N.Y.; Anthony M. Roberti, Austin, Tex.; Wilfried Robert Romich, Wappingers Falls, N.Y.

[73] Assignee: International Business Machines Corporation, Armonk, N.Y.

[21] Appl. No.: 720,541

[22] Filed: Sept. 7, 1976

[51] Int. Cl.² .............................................. B25B 11/00
[52] U.S. Cl. ................................... 269/21; 55/385 A; 55/416; 55/DIG. 29; 98/115 LH; 279/3
[58] Field of Search ................ 55/385 R, 385 A, 416, 55/473, DIG. 29, DIG. 18; 98/115 LH, 36, 115 R; 279/3; 269/21, 321 WE; 118/500, 50

[56] References Cited
U.S. PATENT DOCUMENTS

| | | | |
|---|---|---|---|
| 2,366,925 | 1/1945 | Schmid | 279/3 |
| 3,368,523 | 2/1968 | Becker | 118/50 |
| 3,820,536 | 6/1974 | Anspach, Jr. et al. | 55/385 |
| 3,976,288 | 8/1976 | Cuomo, Jr. | 269/21 |

FOREIGN PATENT DOCUMENTS 255,528  10/1970  U.S.S.R. .......................... 98/115 LH

*Primary Examiner*—Bernard Nozick
*Attorney, Agent, or Firm*—Wesley DeBruin

[57] ABSTRACT

Disclosed is a chuck or handler for carrying thin, substantially planar workpieces intermediate process stations but while maintaining a clean air environment. The chuck includes a substantially planar surface having a workpiece receiving area thereon and a plurality of channels adjacent one edge of the planar surface but superimposed thereof. A conduit is in fluid communication with the channels and includes a foraminous diffuser element in the conduit to equalize the pressure of fluid entering the channels. A source of at least Class 100 air is connected to the conduit for supplying the channels with the gaseous media so that gaseous media emanating from the channels is essentially laminar and flows across the work area to create a surface attachment effect of the air or gaseous media over the workpiece on the work area.

The purpose of this abstract is to enable the public and the Patent Office to determine rapidly the subject matter of the technical disclosure of the Application. This abstract is neither intended to define the invention of the Application nor is it intended to be limiting as to the scope thereof.

9 Claims, 4 Drawing Figures

WAFER HANDLER

SUMMARY OF THE INVENTION AND STATE OF THE PRIOR ART

The present invention relates to a chuck for carrying thin substantially planar workpieces, and more particularly relates to a semiconductor wafer carrying chuck which may be moved intermediate process stations carrying the wafer while maintaining a clean air environment and/or may be used as a work holding chuck for processing steps on the workpiece held thereby.

As the area on a semiconductor wafer becomes more inundated with layer after layer of semiconductor circuits, both active and passive, the importance of clean operations, not only when the wafer is being processed within a particular process station but also when it is being moved intermediate process stations, becomes more important. Particles of dust, dirt, grit or other impurities, no matter how small, can and do impede the normal processing steps which are mandatory for insuring circuit continuity and/or proper capacitance between circuit lines and in many instances effect unwanted short circuits. Conventionally the processing of semiconductor wafers is accomplished in a clean air room while the individual process stations are housed within separate clean air stations or hoods. However, the room environment may be on the order of Class 10,000 while the hood environment is preferably maintained at Class 100. Therefore as the wafers are moved intermediate the process stations, they are moved out of one clean air hood and into the next thereby being exposed to the relatively dirty Class 10,000 environment.

In view of the above, it is a principle object of the present invention to provide a wafer carrying chuck which by its construction maintains a clean air environment for semiconductor wafers during handling and testing even if the surrounding environment is not in a clean air condition.

Another object of the present invention is to provide a wafer carrying handler which may be easily moved by an operator from one station to another without necessitating closed boxes or receptacle for possible contact by an operator in contamination of the wafer.

Still another object of the present invention is to provide a workpiece carrying chuck in which a flow of clean gaseous media is passed across the surface of the workpiece in a laminar condition to form a surface clinging barrier to ambient atmospheric conditions, while preventing particulate contamination of the workpiece.

Yet another object of the present invention is to provide a wafer carrying chuck or handler that is simple in operation, easy to fabricate and relatively inexpensive.

Another object of the present invention is to provide a wafer carrying chuck meeting the above objects but which may also be employed as a work site station, for example, for test equipment such as probes.

Other objects and a more complete understanding of the invention may be had by referring to the following specification and claims taken in conjunction with the accompanying drawing in which:

Figure 1:
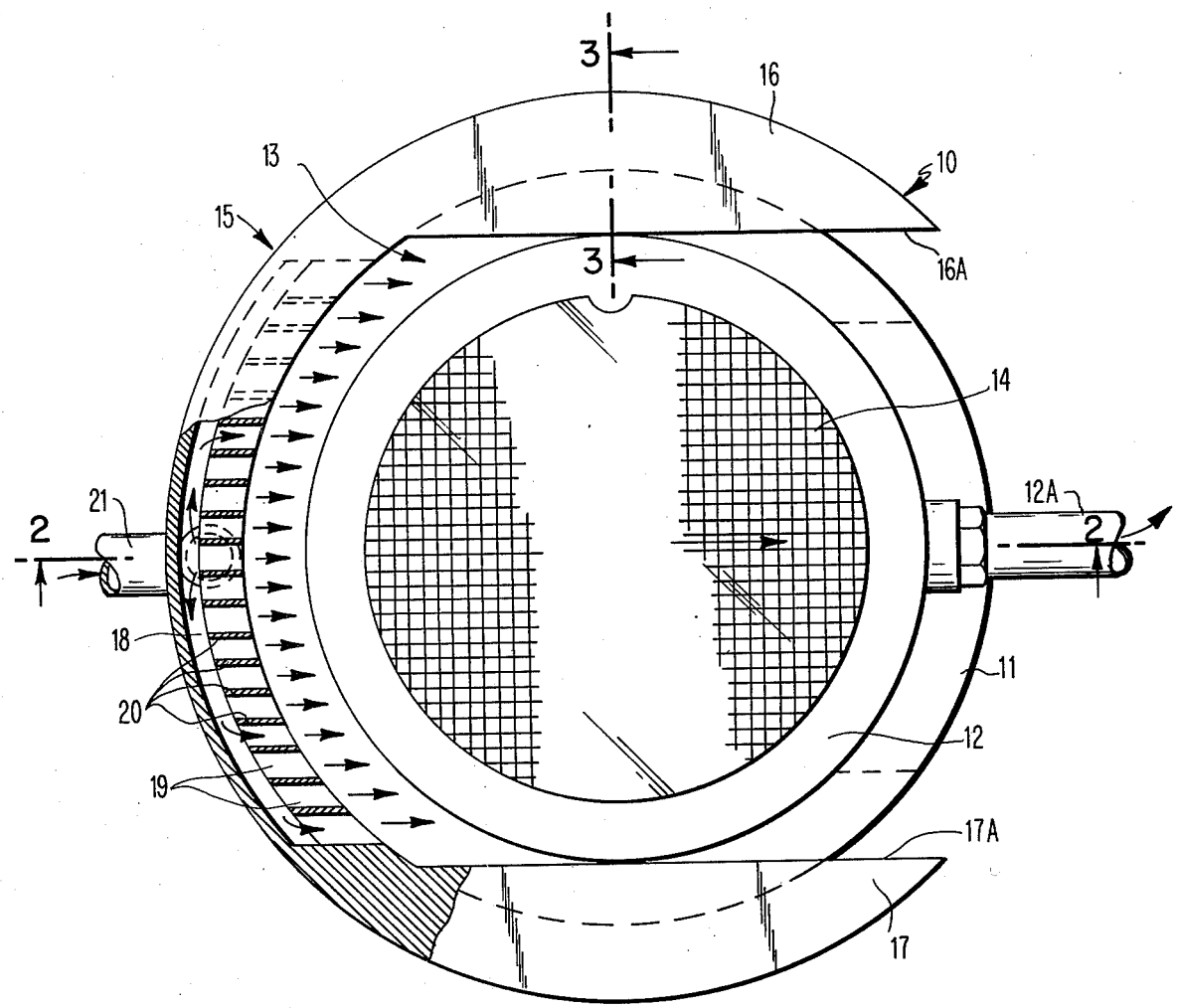
FIG. 1 is a fragmentary plan view of a wafer carrying chuck constructed in accordance with the present invention.
Figure 2:
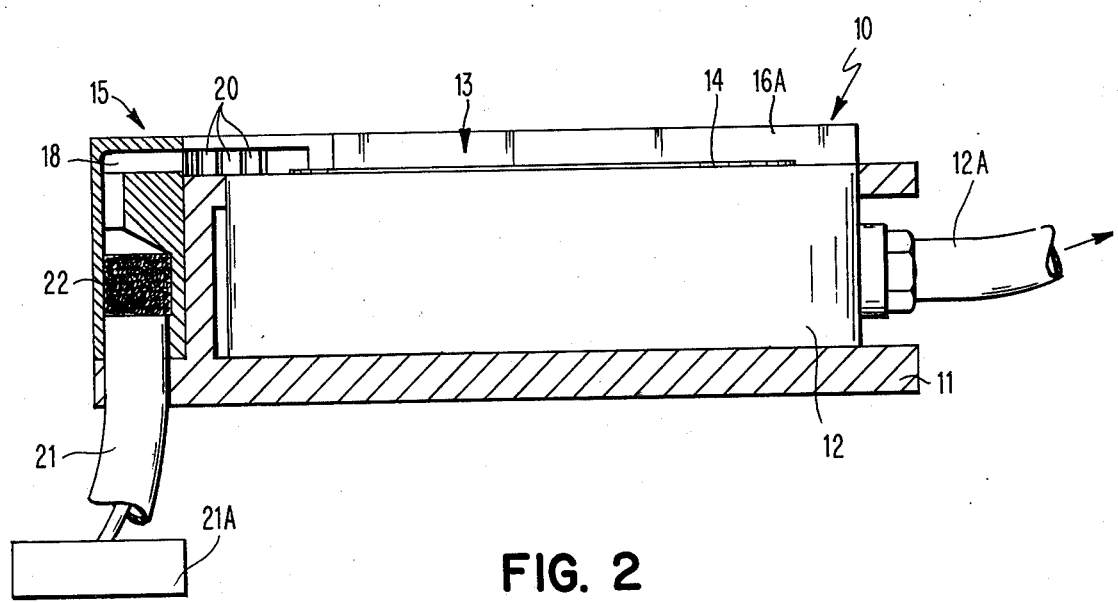
FIG. 2 is a fragmentary sectional view taken along line 2—2 of FIG. 1.

Referring now to the drawings, and especially FIG. 1 thereof, a wafer carrying chuck or handler 10 constructed in accordance with the present invention is illustrated therein. As shown, the chuck includes a base member 11 upon which rests a vacuum platen or plate 12 (having a vacuum supply 12A) and including a workpiece receiving area 13 thereon for receiving a thin substantially planar workpiece such as a semiconductor wafer 14. The vacuum platen or plate 12 may be of any conventional form such as a Temptronics Inc. (Newton, Mass.) vacuum chuck, e.g., Mod. T.P.—31 which includes means for heating and/or cooling the work receiving area 13 so that the wafer or workpiece may be brought to any desired temperature for test purposes etc. A cap member 15 having side skirt portions 16 and 17 respectively joined by an arcuate portion 18 is joined to the base member 11. The arcuate portion 18 includes a plurality of air distribution ports or channels 19 which are spaced from each other as by individual dividing walls 20. The ports or channels are arranged superimposed of one edge of the planar surface or work area 13 so as to provide a laminar flow of gaseous media, for example, air or nitrogen across the surface of the wafer 14.

In order to provide gaseous media to the work area, a conduit 21 connects a source 21A of Class 100 air (for example, from an existing clean air hood, a separate pump and air cleaning supply such as shown in U.S. Pat. No. 3,629,999, Robert C. Marsh et al, issued 12/28/71, the conduit passing into the cap member 15 and then through a foraminous diffuser element 22 which is disposed in the conduit. The foraminous diffuser element may be composed of a stainless steel wool or any other non-outgassing material, and serves to equalize the pressure of the gaseous media entering the channels. In this manner, the diffuser along with the channels serves to provide a laminar flow of gaseous medium across the surface of the wafer.

Figure 3:
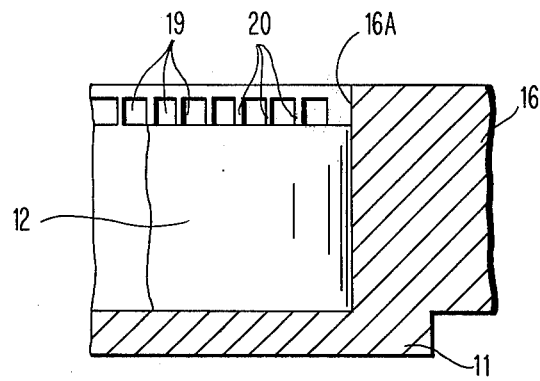
FIG. 3 is a fragmentary sectional view taken along line 3—3 of FIG. 1.

It is essential that the flow of gaseous media across the workpiece or work area be essentially laminar so as to inhibit ambient air flow into and onto either the workpiece or the work area. Experiments have shown that every other kind of flow across the surface of the workpiece creates an air turbulence which aids in ambient air flow entry onto the workpiece or work area. In this connection, and referring now to FIG. 3, the skirts 16 and 17 include depending side wall portions 16A and 17A which are preferably sealed against the work area so as to provide a smooth continuous surface thereby preventing turbulence along the marginal edges of the flow area. Additionally, the depending walls of the skirt are preferably smooth to inhibit unwanted eddy currents along the marginal edges of the work area.

The flow of gaseous media across the work area 13 does not have to be at high volumes but may be in the order of, for example, 16SCFH at about 0.5 inch of water pressure. It should be recognized that a high flow rate across the surface of the work area tends to create turbulence in the ambient atmosphere immediately above the chuck which will tend to pull ambient air into the laminar flow.

Figure 4:
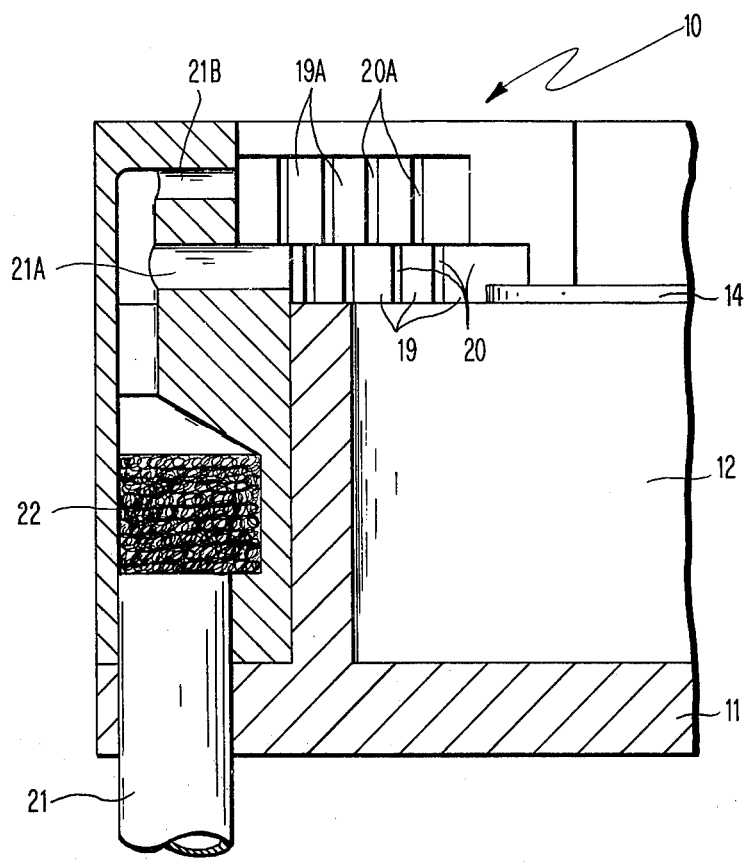
FIG. 4 is a fragmentary side elevational view of another embodiment incorporating the present invention.

In certain instances, and referring now especially to FIG. 4, it is desirable that a double layer laminar gaseous media flow is provided across the work area. This is particularly true in those instances where the ambient atmosphere is not in a clean room environment inasmuch as in a double layer laminar air flow, making the bottom layer move at a higher rate than the upper layer will tend to prevent the introduction of the ambient atmosphere into the flow of laminar air at least until it is past the work area. Referring now to FIG. 4, wherein like parts have been given like numbers, the conduit 21, after the diffuser 22, is split into a large conduit branch 21A and a smaller conduit branch 21B. The larger branch 21A feeds the channels, ducts or ports 19 associated with the bottom laminar flow of gaseous media across the workpiece 14 while the smaller branch 21B feeds the ports, channels or ducts 19A, having dividing walls 20A therein, so that the major volume of flow will occur across and directly adjacent the workpiece 14 while the lower volumetric flow will occur superimposed of the first laminar flow layer.

It should be noted that different pressures occurring at the outlet channels 19 and 19A may also be provided by separate clean gaseous medium supplies as opposed to a single conduit supply with a different diameter branch circuit on the downstream side. In the configuration illustrated in FIG. 4, the lower laminar flow may occur at about 26 SCFH while the upper laminar flow may occur at 9SCFH. Additionally, it should be recognized that the double laminar flow approach such as illustrated in FIG. 4 is useful when the chuck 10 is to be employed as a chuck in a processing station as opposed to simply a transport type chuck. The double laminar flow which occurs at different velocities and different specific flow rates across the surface of the work area, in this instance, will aid in inhibiting particle contamination of the surface of the workpiece or work area.

Although the invention has been described with a certain degree of particularity, it is understood that the present disclosure has been made only by way of example and that numerous changes in the details of construction and the combination and arrangement of parts and the mode of operation may be made without departing from the spirit and the scope of the invention as hereinafter claimed.

What is claimed is:

1. A semiconductor wafer chuck for carrying thin, substantially planar semiconductor workpieces comprising: a substantially planar surface having a workpiece receiving area thereon comprising a vacuum platen for attachment of a workpiece thereto; means defining a plurality of channels adjacent one edge of said planar surface and superimposed thereof; a conduit in fluid communication with said channels, and a foraminous diffuser element in said conduit to equalize the pressure of fluid entering said channels; a source of at least Class 100 gaseous media connected to said conduit for supplying said channels with said gaseous media, whereby gaseous media emanating from said channels flows across the work area to create a laminar flow and a surface attachment effect of the gaseous media over said work area.

2. A chuck in accordance with claim 1 including means to effect attachment of a workpiece to said planar surface in said workpiece receiving area.

3. A chuck in accordance with claim 2 wherein said means to effect attachment of said workpiece to said workpiece receiving area comprises a source of vacuum.

4. A chuck in accordance with claim 1 including a cap member having side skirt portions respectively joined by an arcuate portion and connected to said platen, said arcuate portion including said means defining a plurality of channels, and said side skirt portions extending therefrom to form a side boundary for said work area.

5. A chuck in accordance with claim 4 including depending side walls on said skirt portions which merge into said planar surface and extend outwardly therefrom substantially parallel to said channels.

6. A chuck in accordance with claim 1 including a second plurality of channels superimposed of said first mentioned plurality and means to supply at least Class 100 gaseous media to said second plurality of channels.

7. A chuck in accordance with claim 6 wherein said means to supply at least Class 100 gaseous media to said second plurality of channels comprises branch means from said conduit to said second plurality of channels.

8. A chuck in accordance with claim 7 including means to supply a lower volume of gaseous media to said second plurality of channels than said first plurality of channels.

9. A chuck in accordance with claim 7 wherein said branch means from said conduit and supplying said second plurality of channels is smaller than the portion of said conduit supplying said first plurality of channels.

* * * * *